(12) United States Patent
Lee et al.

(10) Patent No.: US 7,265,374 B2
(45) Date of Patent: Sep. 4, 2007

(54) LIGHT EMITTING SEMICONDUCTOR DEVICE

(75) Inventors: Stephen Lee, Taipei (TW); Yury Georgievich Shreter, St Petersburg (RU); Yury Toomasovich Rebane, St Petersburg (RU); Ruslan Ivanovich Gorbunov, St Petersburg (RU)

(73) Assignee: Arima Computer Corporation, Taipei (TW)

( * ) Notice: Subject to any disclaimer, the term of this patent is extended or adjusted under 35 U.S.C. 154(b) by 83 days.

(21) Appl. No.: 11/150,370

(22) Filed: Jun. 10, 2005

(65) Prior Publication Data

US 2006/0278880 A1 Dec. 14, 2006

(51) Int. Cl.
*H01L 29/06* (2006.01)
(52) U.S. Cl. .............................. 257/13; 257/79; 257/82; 257/257; 257/290; 257/E33.001; 257/E33.076; 257/E31.099; 257/E31.105; 977/759; 977/760; 977/761; 977/773
(58) Field of Classification Search ................ 977/773, 977/759, 760, 761; 257/13, 14, 79, 82, E33.001, 257/E33.076, E31.099, E31.105
See application file for complete search history.

(56) References Cited

U.S. PATENT DOCUMENTS

| 6,233,265 | B1 | 5/2001 | Bour et al. ................... 372/45 |
|---|---|---|---|
| 6,614,060 | B1 | 9/2003 | Wang et al. ................. 257/103 |
| 6,833,201 | B2 * | 12/2004 | Czerw et al. ............... 428/690 |
| 7,022,628 | B2 * | 4/2006 | Kim et al. ................... 438/478 |
| 7,150,910 | B2 * | 12/2006 | Eisler et al. ................. 428/325 |
| 2004/0094756 | A1 * | 5/2004 | Moon et al. ................... 257/13 |
| 2005/0276295 | A1 * | 12/2005 | Kahen et al. ................. 372/39 |
| 2006/0001056 | A1 * | 1/2006 | Saxler ........................ 257/257 |
| 2006/0260674 | A1 * | 11/2006 | Tran ........................... 136/252 |

* cited by examiner

*Primary Examiner*—Thao P. Le
(74) *Attorney, Agent, or Firm*—Silicon Valley Patent Group LLP; Omkar K. Suryadevara

(57) ABSTRACT

A novel NPBL and ANPL light emitting semiconductor device and a method for fabricating the same are provided. In the present invention, plural nano-particles are applied in the active layer of the light emitting semiconductor device, so that the leakage current thereof is reduced. In addition, the provided light emitting semiconductor device fabricated via a planar technology process is microscopically planar, but not planar at micro- and nano-scale. Hence the parasitic wave guiding effect, which suppresses the light extraction efficiency of the light emitting semiconductor device, is destroyed thereby.

21 Claims, 14 Drawing Sheets

LIGHT EMITTING SEMICONDUCTOR DEVICE

FIELD OF THE INVENTION

The present invention relates to a light emitting semiconductor device, in particular to a light emitting semiconductor device with a high efficiency.

BACKGROUND OF THE INVENTION

The light emitting diode (LED) is a fundamental component for electronic lighting technology. While a voltage is applied between the two electrode terminals of LED, which induces an electric current to pass through a p-n junction thereof, the LED will emit lights.

The LED is advantageous for its long duty life, fast responding, high reliability, high electro-optic transforming efficiency and low consumption of electricity. Moreover, the miniaturization of the LED makes it suitable for mass production and makes it meet the requirements and trends for the technical development.

LEDs emitting red, green, blue, infrared and ultraviolet lights have been marketed since early days, while the fabrication for the LED which emits visible lights is increasingly improved presently. Therefore, LEDs are further popularized and applied in various applications including the illumination and the communication.

Typically the LED has a layered structure consisting of a substrate, a buffer layer, an n-type layer, a p-type layer and an active layer, wherein a principal part of the LED is the active layer where the light is generated as a result of recombination process of electrons and holes injected thereinto. Such a layered structure as well as the light emitting semiconductor device containing the layered structure is disclosed in the U.S. Pat. No. 6,233,265. By means of growing light emitting device heterostructures over a thick InGaN layer, a stable InGaN structure is formed so as to avoid the lattice mismatch therefore and permit the realization of an unsegregated, high-indium-content InGaN alloy active region for brighter and more spectrally pure emission of lights.

Please refer to FIG. 1, which shows the layered structure of the LED disclosed in this patent. The LED 100 includes a single-crystal substrate 105, a first buffer layer 110 and a second buffer layer 112, a thick InGaN layer 120 which is n-type doped, an InGaN active layer 130 formed thereon, a first group III-V nitride layer 140 and a second group III-V nitride layer 150 formed thereon, wherein the first group III-V nitride layer 140 and the second group III-V nitride layer 150 are both p-type doped. Moreover, on the second group III-V nitride layer 150 and the exposed thick InGaN layer 120 are a p-electrode 160 and an n-electrode 170, respectively.

According to the specification of this patent, the two buffer layers 110 and 112 may have different alloy concentrations or be deposited under different conditions to promote the smooth film growth and to accommodate the large lattice mismatch therefore. Furthermore, since the first group III-V nitride layer 140 typically has a bandgap energy higher than that of the second group III-V nitride layer 150, so that the injected electrons are confined to the active region. As a result, the InGaN alloy phase separation is minimized and the compositional uniformity of InGaN layers is improved, so that the spectral emission of blue, green, and even red LEDs becomes more pure thereby.

The conventional LED chip is cut from this structure and packed in epoxy with a refractive index of 1.5 which is less than those of the layers in the structure. Since the LED structure has a planar shape and consists of the layers which have refractive indices higher than 1.5, a planar waveguide is easily formed therein which may capture the lights emitted at high incident angles. Such a wave guiding effect will seriously suppress the light extraction efficiency of LED and is related to the planar technology for the LED structure growth from vapor phase.

A method and an LED structure for improving the light extraction efficiency are disclosed in the U.S. Pat. No. 6,614,060. Please refer to FIG. 2, which schematically shows the LED structure according to the disclosure of this patent. The LED 200 typically includes a substrate 210, a buffer layer 220, an n-type contact layer 230, an active layer 240, a p-type contact layer 250 and an n-electrode as well as a p-electrode which are not shown in this figure. In order to further reduce the electron current leakage, a blocking layer 245 is configured between the active layer 240 and the p-type contact layer 250. Besides, the active layer 240 may be a layer sequence which has two well systems (WW, QW) with charge asymmetric resonance tunneling. One of the well systems is a wide well (WW) 241 and the other is an active quantum well (QW) 243, which are both made of InGaN. The wide well (WW) 241 and the active quantum well (QW) 243 are coupled via a resonance tunneling barrier 242 which is transparent for electrons and blocking for holes.

Accordingly, the capture efficiency for electrons is increased due to the direct tunneling of electrons from the WW 241 into the QW 243, so that the electrons current leakage into the p-type contact layer 250 is suppressed and the light extraction efficiency of LED 200 is further enhanced. However, such a design is disadvantageous for that a small number of structural defects existing in the mentioned layer sequence will seriously damage the light extraction efficiency of LED, and the wavelength of light generated by the QW is fixed so that a white light is unable to be generated therethrough.

Based on the above, it is apparent that the light extraction efficiency of a conventional light emitting semiconductor device is dominated and limited by the planar waveguide effect resulting from the planar technology for the light emitting semiconductor device and by the electrons current leakage in the active layer thereof.

For overcoming the mentioned drawbacks in this art, a novel structure of the light emitting semiconductor device is provided in the present invention. In comparison with the conventional ones, the provided light emitting semiconductor device is macroscopically planar but is not planar at a micro-scale or a nano-scale, so as to destroy the parasitic wave guiding effect and reduce the leakage currents thereof. Hence the light extraction efficiency of light emitting semiconductor device is increasingly enhanced thereby. Furthermore, the present invention also allows the direct generation for white light via a simplified method.

SUMMARY OF THE INVENTION

The present invention provides a light emitting semiconductor device structure with a nano-particle buffer layer (NPBL) and further provides a light emitting semiconductor device structure with an active layer made of light emitting and current blocking nano-particles (ANPL).

In accordance with a first aspect of the present invention, a light emitting semiconductor device is provided. The light emitting semiconductor device includes a substrate, a buffer layer on the substrate, a first contact layer having a first type of a dopant on the buffer layer, an active layer having a plurality of first nano-particles on the first contact layer, and a second contact layer having a second type of a dopant on the active layer.

Preferably, the substrate is made of an aluminum oxide.

Preferably, the buffer layer is made of a gallium nitride.

Preferably, the first contact layer includes a layer of a silicon-doped gallium nitride.

Preferably, the first contact layer is an n-type contact layer.

Preferably, the second contact layer is a p-type contact layer.

Preferably, the active layer is made of a semiconducting material.

Preferably, the semiconducting material is one of a gallium nitride and a boron-aluminum-gallium nitride.

Preferably, the first nano-particles are made of an indium-gallium nitride.

Preferably, the first nano-particles are covered by a first shell.

Preferably, the first shell is made of one selected from a group consisting of a boron-aluminum-gallium nitride, a silicon oxide and a silicon nitride.

Preferably, the active layer further includes a plurality of second nano-particles.

Preferably, the second nano-particles are made of a boron-aluminum-gallium nitride.

Preferably, the second nano-particles are covered by a second shell.

Preferably, the second shell is made of one selected from a group consisting of a boron-aluminum-gallium nitride, a silicon oxide and a silicon nitride.

Preferably, the nano-particles have a particle size ranged from 10 nanometers to 1000 nanometers.

Preferably, the second contact layer includes a layer of a magnesium-doped gallium nitride.

Preferably, the light emitting semiconductor device further includes a first cladding layer having the first type of the dopant and sandwiched between the first contact layer and the active layer.

Preferably, the light emitting semiconductor device further includes a second cladding layer having the first type of the dopant and sandwiched between the active layer and the second contact layer.

In accordance with a second aspect of the present invention, a light emitting semiconductor device is provided. The light emitting semiconductor device includes a substrate, a first buffer layer having a plurality of nano-particles on the substrate, a first contact layer having a first type of a dopant on the first buffer layer, an active layer with quantum wells on the first contact layer and a second contact layer having a second type of a dopant on the active layer.

Preferably, the first buffer layer is made of one of a doped semiconducting material and an undoped semiconducting material.

Preferably, the doped semiconducting material is a silicon-doped gallium nitride.

Preferably, the light emitting semiconductor device further includes a second buffer layer sandwiched between the substrate and the first buffer layer.

Preferably, the first contact layer is an n-type contact layer.

Preferably, the second contact layer is a p-type contact layer.

Preferably, the nano-particles are made of one selected from a group consisting of a silicon oxide, a silicon nitride, an aluminum oxide, a gallium oxide and a boron nitride.

Preferably, the nano-particles are a plurality of hollow nano-particles.

Preferably, the hollow nano-particles are further filled with a phosphor.

Preferably, the active layer is made of a gallium-aluminum-indium phosphide.

In accordance with a third aspect of the present invention, a method for fabricating a light emitting semiconductor device is provided. The method includes steps of (a) providing a substrate, (b) forming a buffer layer on the substrate, (c) forming a first contact layer having a first type of a dopant on the buffer layer, wherein the first contact layer has a dopant of a first type; (d) forming an active layer having a plurality of nano-particles on the first contact layer, (e) forming a second contact layer having a second type of a dopant on the active layer, (f) forming a metallization layer on the second contact layer, (g) removing a part of the metallization layer, the second contact layer, the active layer and the first contact layer so as to expose at least a part of the first contact layer, and (h) forming a third contact layer on the exposed first contact layer.

In accordance with a fourth aspect of the present invention, a method for fabricating a light emitting semiconductor device is provided. The method includes steps of (a) providing a substrate, (b) forming a buffer layer having a plurality of nano-particles on the substrate, (c) forming a first contact layer having a first type of a dopant on the buffer layer, (d) forming an active layer with quantum wells on the first contact layer, and (e) forming a second contact layer having a second type of a dopant on the active layer.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
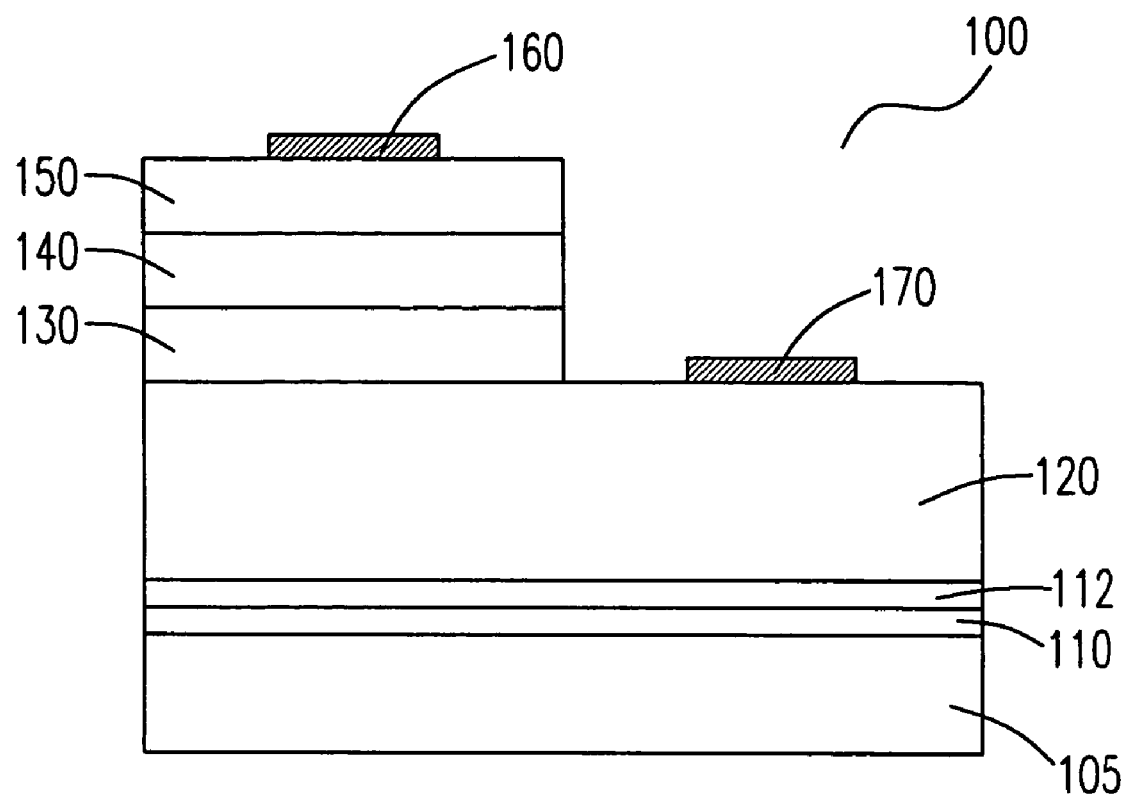
FIG. 1 is a diagram illustrating the layered structure of a conventional LED according to the prior art.
Figure 2:
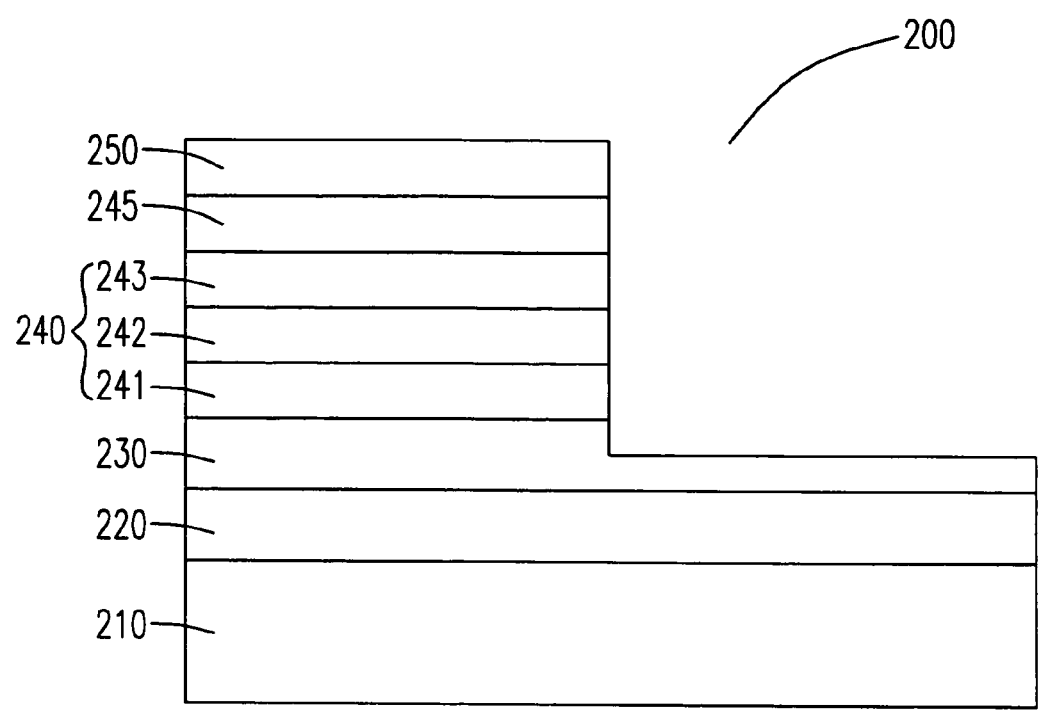
FIG. 2 is a diagram illustrating the layered structure of another conventional LED according to the prior art.
Figure 3:
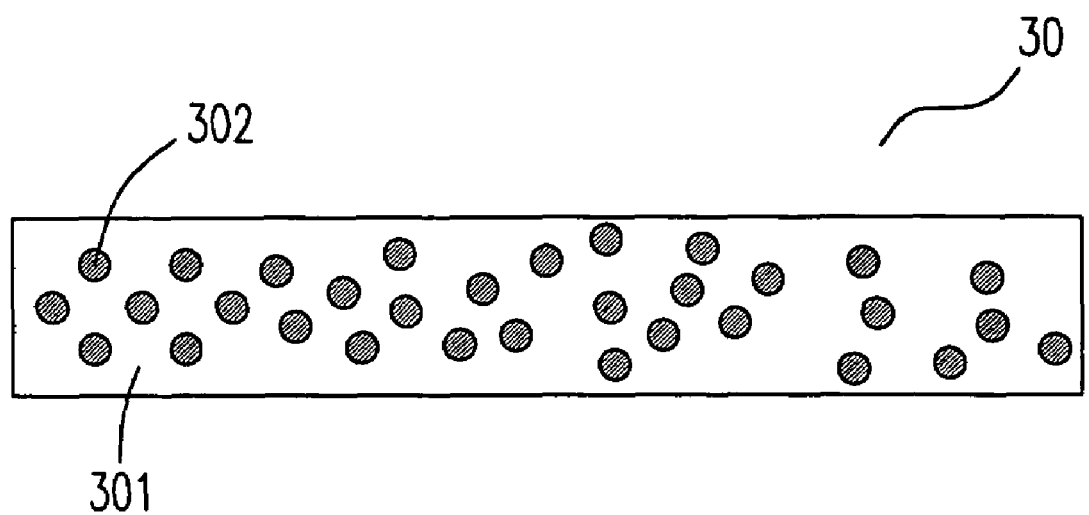
FIG. 3 is a diagram illustrating the nano-particle buffer layer (NPBL) of the light emitting semiconductor device according to the present invention.

Please refer to FIG. 3, which schematically shows a general structure of the nano-particle buffer layer (NPBL) of the present invention. The NPBL 30 consists of a host layer 301 and a plurality of nano-particles 302, in which the host layer 301 is a doped or an undoped crystalline semiconductor material and the nano-particles 302 are crystalline, polycrystalline or amorphous particles. Moreover, the nano-particles 302 are made silicon oxides, silicon nitrides, aluminum oxides, gallium oxides or boron nitrides, e.g. $SiO_2$, $Si_3N_4$, $Al_2O_3$, $Ga_2O_3$ and BN, respectively.

Figure 4:
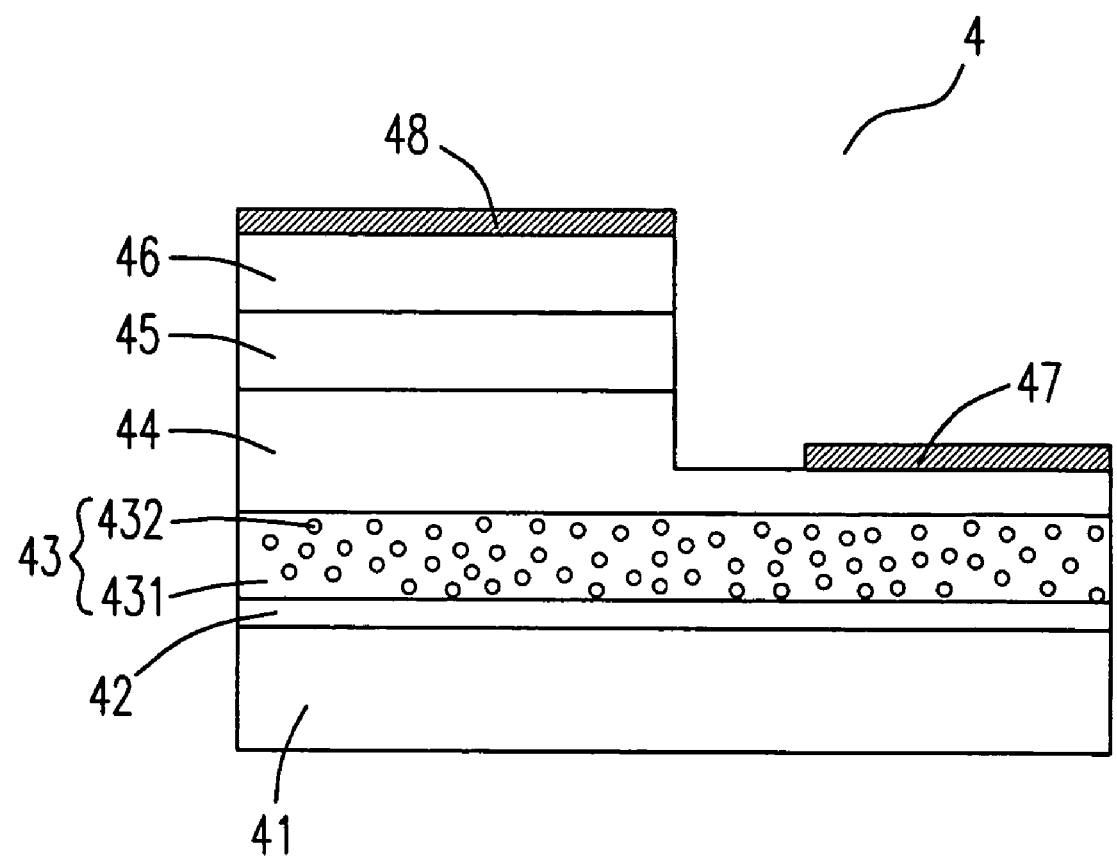
FIG. 4 is a diagram illustrating a NPBL light emitting diode (LED) for generating a blue light according to a first preferred embodiment of the present invention.

Please refer to FIG. 4, which schematically shows a NPBL light emitting diode (LED) for generating a blue light, which is so-called a blue NPBL LED hereafter, according to a first preferred embodiment of the present invention. The blue NPBL LED 4 includes a substrate 41, and thereon a layer sequence consisting of a first buffer layer 42, a second buffer layer 43, a first contact layer 44, an active layer 45 and a second contact layer 46. A first electrode 47 and a second electrode 48 are further fabricated on the exposed first contact layer 44 and the second contact layer 46, respectively.

In this embodiment, the substrate 41 is typically an $Al_2O_3$ substrate and the first buffer layer 42 is made of GaN with a thickness of 200 Å. The second buffer layer 43 is an NPBL which is made of an n-type GaN layer doped by silicon (Si) 431 with a doping level of $10^{17}$~$10^{19}$ atoms/cm$^3$ and contains $SiO_2$ nano-spheres 432 with a diameter of 10~1000 nm therein. The thickness of the n-type GaN layer doped by silicon (Si) 431 is ranged from 1 µm to 2 µm, and the concentration of the $SiO_2$ nano-spheres 432 depends on the diameter thereof, which is stated as follows:

$N_1=0.001/d_1^3$~$0.1/d_1^3$, wherein $N_1$ represents the concentration of the $SiO_2$ nano-spheres 432 and $d_1$ represents the diameter thereof.

The first contact layer 44 is an n-type layer which is made of an n-type GaN layer doped by silicon (Si) with a doping level of $5\times10^{18}$~$5\times10^{19}$ atoms/cm$^3$ and has a thickness of 1~2 µm. On the first contact layer 44 the active layer 45 with InGaN quantum wells is deposited where the blue light is generated.

The second contact layer 46 on the active layer 45 is a p-type layer which is made of a p-type GaN doped with magnesium (Mg) at a concentration of $10^{18}$~$10^{21}$ atoms/cm$^3$ and has a thickness of 0.5 µm. The whole structure is etched so as to expose the first contact layer 44, and the first electrode 47 which is an n-type contact is deposited on the exposed first contact layer 44. The second electrode 48 is a transparent metallic alloy contact which is deposited on the second contact layer 46.

In this case, the laterally propagating blue light rays captured in the blue NPBL LED 4 are scattered and converted into vertical rays by the $SiO_2$ nano-particles 432 in the second buffer layer 43. The vertical blue light rays can escape the LED structure through the front surface, so that the light extraction efficiency of the LED is increased.

Figure 5:
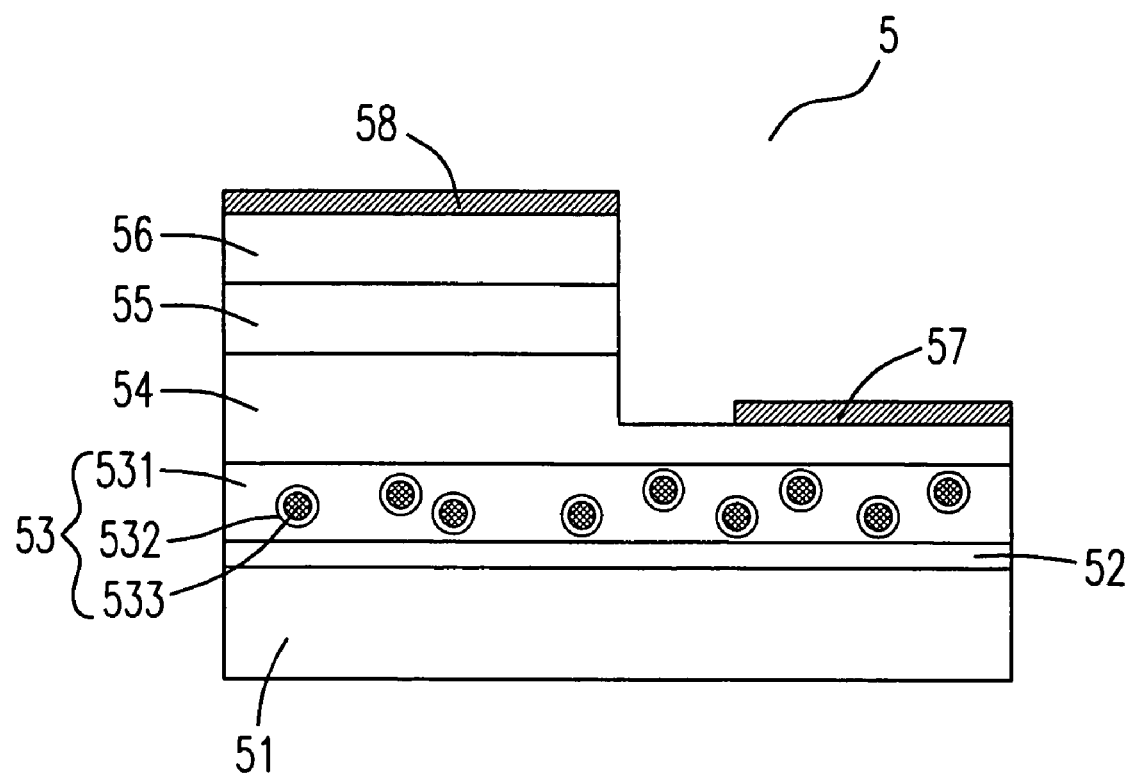
FIG. 5 is a diagram illustrating a NPBL light emitting diode (LED) for generating a white light according to a second preferred embodiment of the present invention.

Please refer to FIG. 5, which schematically shows a NPBL light emitting diode (LED) for generating a white light, which is so-called a white NPBL LED hereafter, according to a second preferred embodiment of the present invention. The white NPBL LED 5 has a similar layered structure as that of the blue NPBL LED 4 in FIG. 4. The white NPBL LED 5 includes a substrate 51, and thereon a layer sequence consisting of a first buffer layer 52, a second buffer layer 53, a first contact layer 54, an active layer 55 and a second contact layer 56. A first electrode 57 and a second electrode 58 are further fabricated on the exposed first contact layer 54 and the second contact layer 56, respectively.

In this embodiment, the second buffer layer 53 is an NPBL which is made of an n-type GaN layer doped by silicon (Si) 531 with a doping level of $10^{17}$~$10^{19}$ atoms/cm$^3$ and contains $SiO_2$ hollow nano-spheres 532 with a diameter of 10~1000 nm therein. The thickness of the n-type GaN layer doped by silicon (Si) 531 is ranged from 1 µm to 2 µm, and the concentration of the $SiO_2$ hollow nano-spheres 532 depends on the diameter thereof, which is stated as follows:

$N_2=0.001/d_2^3$~$0.1/d_2^3$, wherein $N_2$ represents the concentration of the $SiO_2$ hollow nano-spheres 532 and $d_2$ represents the diameter thereof.

The $SiO_2$ hollow nano-spheres 532 are further filled with a phosphor 533 whereby the ultraviolet light rays generated in the active layer 55 are converted into white lights. Moreover, the laterally propagating white light rays captured in the white NPBL LED 5 are scattered and converted into vertical rays by the $SiO_2$ hollow nano-particles 532 in the second buffer layer 53. The vertical white light rays can escape the LED structure through the front surface, so that the light extraction efficiency of the LED is increased.

In this preferred embodiment, the layered structure of the white NPBL LED 5 is similar to that of the blue NPBL LED 4 except for the structure of the second buffer layer 53 and hence is not repeatedly mentioned.

Figure 6:
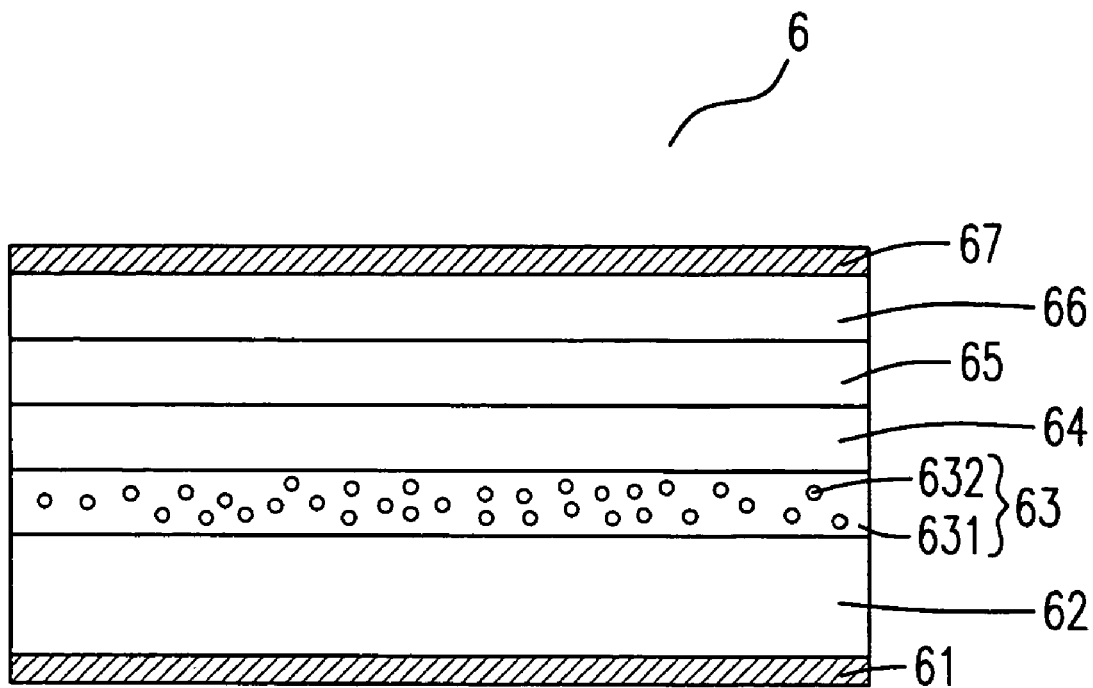
FIG. 6 is a diagram illustrating a NPBL light emitting diode (LED) for generating a red light according to a second preferred embodiment of the present invention.

Please refer to FIG. 6, which schematically shows a NPBL light emitting diode (LED) for generating a red light, which is so-called a red NPBL LED hereafter, according to a third preferred embodiment of the present invention. The red NPBL LED 6 includes a substrate 62 with an attached first electrode 61 and thereon a layer sequence consisting of a buffer layer 63, a first contact layer 64, an active layer 65 and a second contact layer 66 on which a second electrode 67 is further fabricated.

In this embodiment, the first electrode 61 is a metallic contact and the substrate 62 is an n-type GaAs substrate with a width of 100~300 µm. The buffer layer 63 is an NPBL which is made of an $Al_{0.5}In_{0.5}P$ layer doped by silicon (Si) 631 with a doping level of $10^{17}$~$10^{19}$ atoms/cm$^3$ and contains $SiO_2$ nano-spheres 632 with a diameter of 10~1000 nm therein. The thickness of the $Al_{0.5}In_{0.5}P$ layer doped by silicon (Si) 631 is ranged from 1 μm to 2 μm, and the concentration of the $SiO_2$ nano-spheres 632 depends on the diameter thereof, which is stated as $N_3=0.001/d_3^3$, wherein $N_3$ represents the concentration of the $SiO_2$ nano-spheres 632 and $d_3$ represents the diameter thereof.

The first contact layer 64 is an n-type contact with a thickness of 0.5 μm which is made of an n-type $Al_{0.5}In_{0.5}P$ layer doped by silicon (Si) with a doping level of $5\times10^{18}\sim10^{19}$ atoms/cm$^3$. On this layer the active layer 65 with $Al_xGa_{0.5-x}In_{0.5}P$ quantum wells is deposited where the red light is generated.

The second contact layer 66 on the active layer 65 is a p-type contact layer with a thickness of 0.5 μm which is made of a p-type $Al_{0.5}In_{0.5}P$ layer doped by silicon (Si) with a doping level of about $10^{18}$ atoms/cm$^3$. The second electrode 67 on the second contact layer is typically a transparent metallic alloy contact.

In this case, the laterally propagating red light rays captured in the red NPBL LED 6 are scattered and converted into vertical rays by the $SiO_2$ nano-particles 632 in the second buffer layer 63. The vertical red light rays can escape the LED structure through the front surface, so that the light extraction efficiency of the red LED with an opaque GaAs substrate is increased.

The mentioned NPBL LED structure has two advantages over the conventional LED structures.

First, the NPBL scatters the laterally propagating light rays captured in the LED structure and converts them into vertical rays which are able to escape the LED structure through the front surface thereof. Thus, the light extraction efficiency of the LED is increasingly enhanced via the NPBL structure therein.

Second, a threading dislocation and other threading defects propagating along the layer growth direction are stopped via adding the NPBL in the conventional LED structure before the growth of the active layer, which results in an improvement of the quality of the active layer and an enhancement of the internal quantum efficiency of the LED.

In addition to the mentioned $SiO_2$ nano-spheres, nano-spheres made of other materials are also preferable to enhance the light extraction efficiency of the LED and stop the dislocation moving therein, such as silicon nitrides, aluminum oxides, gallium oxides and boron nitrides. Furthermore, the NPBL with $SiO_2$ hollow nano-spheres containing a phosphor therein is able to convert the wavelength of the light generated in the active layer, which can be applied for the production of novel multi-color or white LEDs.

Besides the mentioned blue NPBL LED, the white NPBL LED and the red NPBL LED, a laser diode with the NPBL structure is also provided in the present invention.

Figure 7:
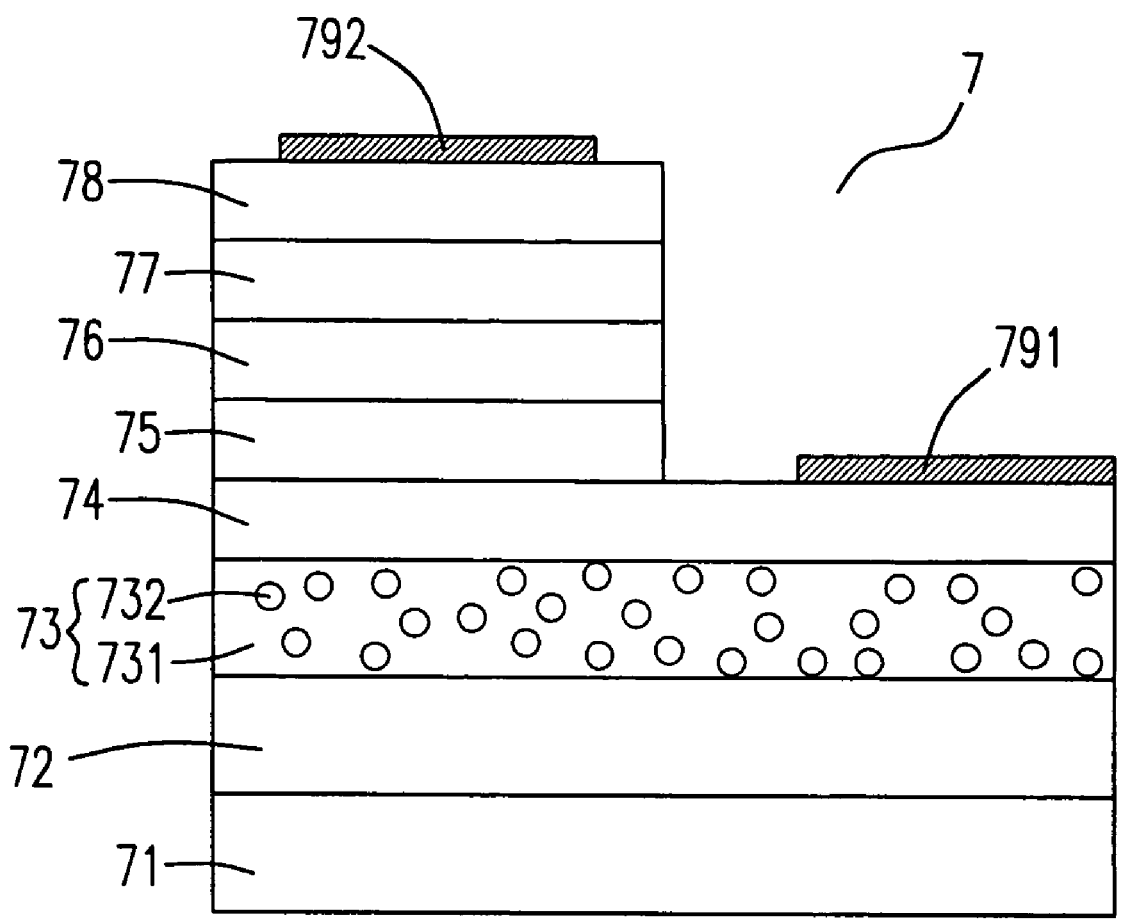
FIG. 7 is a diagram illustrating a laser diode with a NPBL for generating a red light according to a fourth preferred embodiment of the present invention.

Please refer to FIG. 7, which schematically shows a laser diode with a NPBL for generating a red light according to a fourth preferred embodiment of the present invention. The laser diode 7 includes a substrate 71 and thereon a layer sequence consisting of a first buffer layer 72, a second buffer layer 73, a first contact layer 74, a first cladding layer 75, an active layer 76, a second cladding layer 77 and a second contact layer 78. A first electrode 791 and a second electrode 792 are further fabricated on the exposed first contact layer 74 and the second contact layer 78, respectively.

In this embodiment, the substrate 71 is typically an $Al_2O_3$ substrate and the first buffer layer 72 is made of GaN. The second buffer layer 73 is an NPBL which is made of a GaN layer doped by silicon (Si) 731 and contains $SiO_2$ nano-spheres 732 with a diameter of 10~1000 nm therein. In this case, the concentration of the $SiO_2$ nano-spheres 732 depends on the diameter thereof, which is stated as follows:

$N_4=0.001/d_4^3\sim0.1/d_4^3$, wherein $N_4$ represents the concentration of the $SiO_2$ nano-spheres 732 and $d_4$ represents the diameter thereof.

The first contact layer 74 is an n-type layer and on the first contact layer 74 is the first cladding layer 75 which is an n-doped layer. On the first cladding layer 75 is the active layer 76 with InGaN quantum wells.

The second cladding layer 77 and the second contact layer 78 are deposited on the active layer 76 in order, and both of which are p-doped layers. The whole structure is etched so as to expose the first contact layer 74, and the first electrode 791 which is an n-electrode is deposited on the exposed first contact layer 74. The second electrode 792 is a p-electrode which is deposited on the second contact layer 78.

While a positive bias is applied between the first electrode 791 and the second electrode 792, electrons in the conduction band will flow from the n-doped first contact layer 74 and the n-doped first cladding layer 75 to a lower energy state in the active layer 76 and holes in the valence band of the p-doped second cladding layer 77 and the p-doped second contact layer 78 will also flow therefrom to the active layer 76 where the emission of light is generated by the recombination of the electrons and holes.

Similarly, the threading dislocation in the buffer layers, between the buffer layer and the substrate and along the layer growth direction are stopped via the nano-spheres 732 in the second buffer layer 73, so as to improve the crystal property of the active layer 76 and further enhance the internal quantum efficiency of the laser diode 7.

Figure 8:
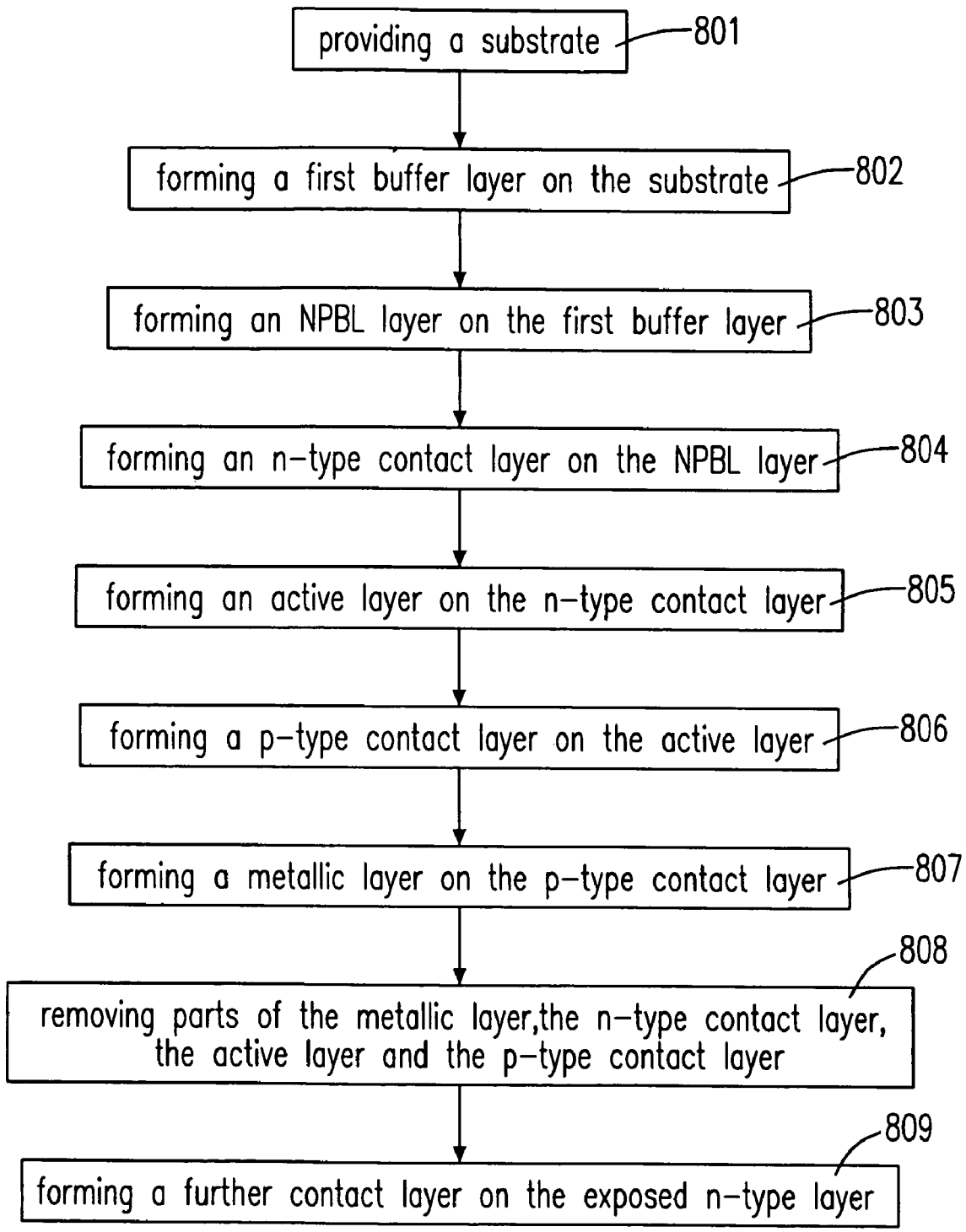
FIG. 8 is a flow chart illustrating a method for fabricating the light emitting semiconductor device with the NPBL structure according to the preferred embodiments of the present invention.

In addition, a method for fabricating the light emitting semiconductor device with the NPBL structure according the mentioned embodiments is also provided in the present invention. Please refer to FIG. 8, which is a flow chart illustrating the provided method. First, a substrate is provided and thereon a first buffer layer is deposited as shown in the steps 801 and 802, respectively. Then, a second buffer layer having plural nano-particles, i.e. an NPBL layer, is fabricated on the first buffer layer as shown in the step 803. On the NPBL layer an n-type contact layer and an active layer with quantum wells are deposited in order as shown in the steps 804 and 805, respectively. Afterward, a p-type contact layer is deposited on the active layer as shown in the step 806, and a metallic layer is formed on the p-type contact layer as a p-electrode as shown in the step 807. After removing parts of the metallic layer, the n-type contact layer, the active layer and the p-type contact layer via etching, the first contact layer is exposed and thereon a further contact layer is deposited as an n-electrode, as shown in the steps 808 and 809, respectively.

It is worthy to be mentioned that various light emitting semiconductors including the blue NPBL LED, the white NPBL LED and the laser diode are able to be simply fabricated via selecting the materials for the layers and the nano-particles appropriately in the mentioned steps.

Figure 9:
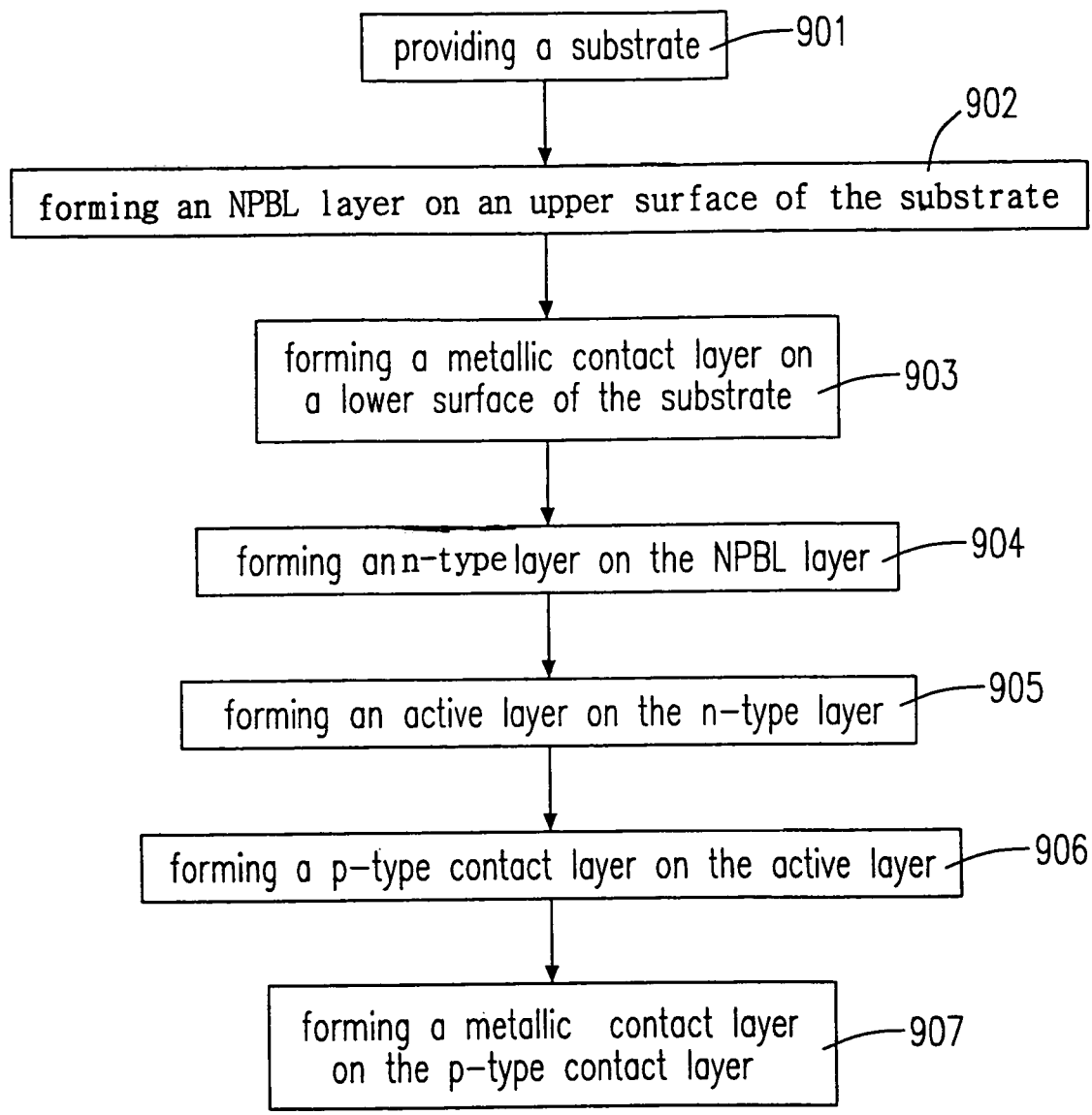
FIG. 9 is a flow chart illustrating a method for fabricating an NPBL LED for generating a red light according to the preferred embodiment of the present invention.

Additionally, a method for fabricating an NPBL LED for generating a red light is provided in the present invention. Please refer to FIG. 9, which is a flow chart illustrating the basic steps of the method for fabricating an NPBL LED for generating a red light according to the preferred embodiment of the present invention. First, a substrate is provided as shown in the step 901. Then, an NPBL layer is formed on an upper surface of the provided substrate and a metallic contact layer is deposited on a lower surface of the provided substrate as shown in the steps 902 and 903, respectively. Afterward, an n-type layer, i.e. an n-doped contact layer, is formed on the NPBL layer as shown in the step 904. For example, the NPBL layer is made of an $Al_{0.5}In_{0.5}P$ layer doped by silicon (Si) with a doping level of $10^{17} \sim 10^{19}$ atoms/cm$^3$ and contains $SiO_2$ nano-spheres with a diameter of 10~1000 nm therein.

An active layer where a red light is generated is subsequently deposited on the n-type layer as shown in the step 905. Finally, a p-type contact layer, i.e. a p-doped contact layer, is deposited on the active layer, and a metallic contact layer in formed thereon as shown in the steps 906 and 907, respectively.

According to the above, the present invention provides a novel NPBL layer, i.e. a buffer layer with plural nano-particles therein, for improving the light extraction efficiency of the LED. In comparison with the conventional LEDs, the laterally propagating lights captured therein are scattered and converted into vertical ones by the nano-particles contained in the NPBL layer of the LED of the present invention, so as to improve the brightness thereof. Moreover, the addition of nano-particles before the active layer growth allows it to stop threading dislocation and other threading defects propagating along the growth direction. The quality of the active layer is hence improved and the internal quantum efficiency of the LED is enhanced, accordingly.

In addition to the mentioned embodiments, the layer, which contains the nano-particles, is alterable in the present invention. For example, the addition of nano-particles in the active layer of the LED is preferred, and the active layer with the nano-particles is referred as an ANPL (active layer made of light emitting and current blocking nano-particles) layer.

Figure 10:
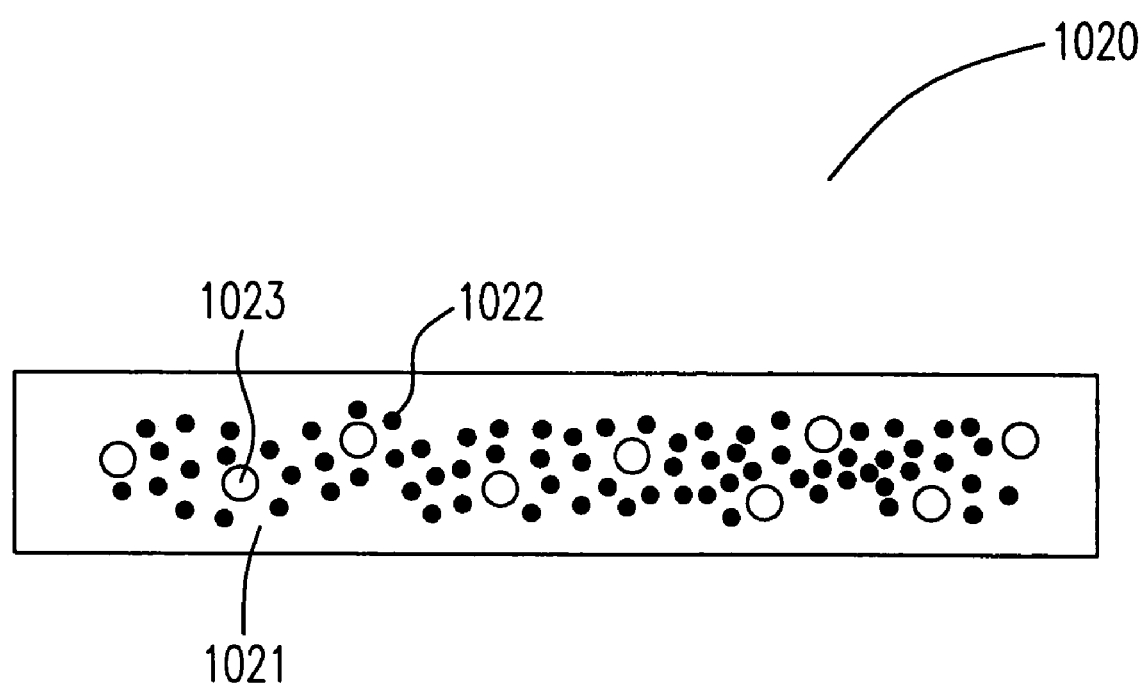
FIG. 10 is a diagram illustrating an active layer made of light emitting and current blocking nano-particles (ANPL) of the light emitting semiconductor device according to the present invention

Please refer to FIG. 10 illustrating an active layer made of light emitting and current blocking nano-particles (ANPL) of the light emitting semiconductor device according to the present invention. The active layer 1020 contains a host layer 1021 with inclusions of the first nano-particles 1022, i.e. the light emitting nano-particles, and inclusions of the second nano-particles 1023, i.e. the current blocking nano-particles. For example, the host layer 1021 is a semiconductor material of gallium nitride or of boron-aluminum-gallium nitride. In this preferred embodiment, the second nano-particles 1023 for current blocking are made of a material with band gap higher than that of the host layer 1021. For more specific, the first nano-particles 1022 for light emitting are made of a crystalline, a polycrystalline or an amorphous indium-gallium nitride with a shell of boron-aluminum-gallium nitride, silicon oxide or silicon nitride, and the second nano-particles 1023 for current blocking are made of a crystalline, a polycrystalline or an amorphous gallium-aluminum nitride or boron-aluminum-gallium nitride, which are also covered with a shell of boron-aluminum-gallium nitride, silicon oxide or silicon nitride.

Figure 11:
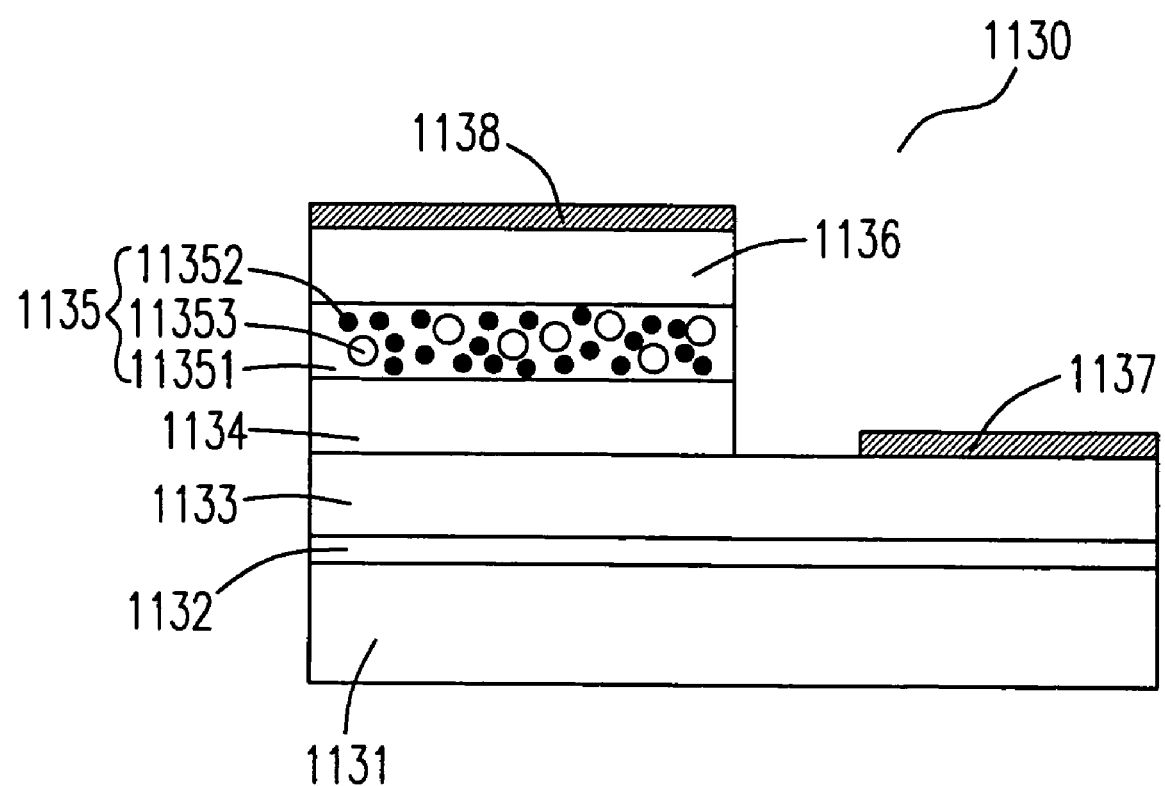
FIG. 11 is a diagram illustrating an ANPL light emitting diode (LED) for generating a blue light according to a fifth preferred embodiment of the present invention.

Please refer to FIG. 11 which schematically shows an ANPL light emitting diode (LED) for generating a blue light, which is so-called a blue ANPL LED hereafter, according to a fifth preferred embodiment of the present invention. The blue ANPL LED 1130 includes a substrate 1131, and thereon a layer sequence consisting of a buffer layer 1132, a first contact layer 1133, an electron emitter layer 1134, an active layer 1135 and a second contact layer 1136. A first electrode 1137 and a second electrode 1138 are further fabricated on the exposed contact layer 1133 and the second contact layer 1136, respectively.

In this embodiment, the substrate 1131 is typically a sapphire substrate, i.e. a substrate of $Al_2O_3$. The buffer layer 1132 is made of GaN with a thickness of 200 Å. The first contact layer 1133 is made of an n-type GaN layer doped by silicon (Si) with a doping level of $5 \times 10^{18} \sim 5 \times 10^{19}$ atoms/cm$^3$, and the thickness thereof is ranged from 2~3 μm. The electron emitter layer 1034 is a layer of $In_{0.5}Ga_{0.85}N$ with a thickness of 500 Å which is epitaxially grown on the first contact layer 1133.

The active layer 1135 has a similar structure as shown in FIG. 10, wherein the host layer 11351 is an undoped GaN layer with a thickness of 10~100 nm, the first nano-particles 11352 for light emitting are made of indium-gallium nitride, whose particle diameter is ranged from 10 to 100 nm, and the second nano-particles 11353 for current blocking are made of gallium-aluminum or boron-aluminum gallium, whose particle diameter is ranged from 5 to 50 nm, preferably.

The second contact layer 1136 on the active layer 1135 is a p-type layer which is made of a p-type GaN doped with magnesium (Mg) at a concentration of $10^{18} \sim 10^{21}$ atoms/cm$^3$ and has a thickness of 0.5 μm. The whole structure is etched so as to expose the light emitting layer 1034, and the first electrode 1137 which is an n-type contact is deposited on the exposed first contact layer 1133. The second electrode 1138 is a transparent metallic alloy contact which is deposited on the second contact layer 1136.

The blue ANPL LED 1130 exhibits a higher efficiency of light generation since the structural property of the first nano-particles 11352 for light emitting, i.e. the InGaN nano-particles, are better than the conventional InGaN active quantum well. Besides, the radiative efficiency of ANPL structure only slightly sensitive to the threading dislocation causing non-radiative recombination since the lateral motion of electrons and holes in the ANPL structure is suppressed by the second nano-particles 11353 for current blocking, i.e. the AlGaN nano-particles.

Figure 12:
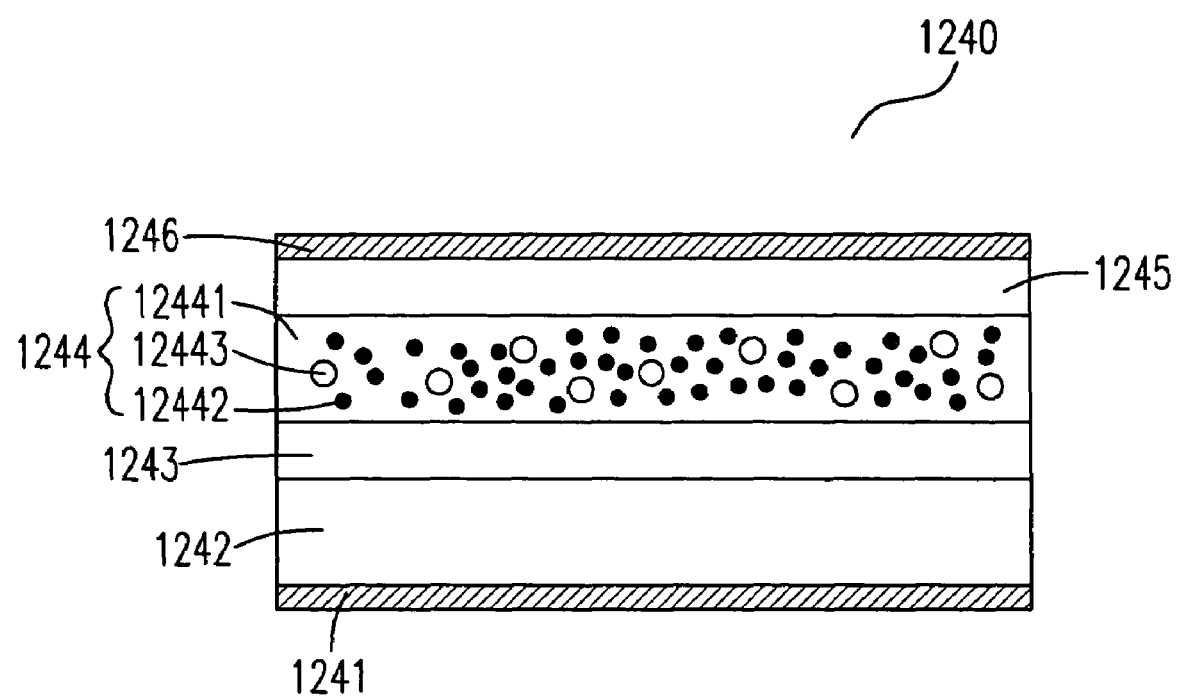
FIG. 12 is a diagram illustrating an ANPL light emitting diode (LED) for generating a white light according to a sixth preferred embodiment of the present invention.

Please refer to FIG. 12 which schematically shows an ANPL light emitting diode (LED) for generating a white light, which is so-called a white ANPL LED hereafter, according to a sixth preferred embodiment of the present invention. The white ANPL LED 1240 includes a substrate 62 with an attached first electrode 1241 and thereon a layer sequence consisting of a first contact layer 1243, an active layer 1244 and a second contact layer 1245 on which a second electrode 1246 is further fabricated.

In this embodiment, the first electrode 1241 is a metallic contact and the substrate 1242 is an n-type GaN substrate with a width of 70~150 μm. The first contact layer 1243 is an n-type contact with a thickness of 0.5 μm which is made of an n-type GaN layer doped by silicon (Si) with a doping level of $5 \times 10^{18} \sim 5 \times 10^{19}$ atoms/cm$^3$. On this layer the active layer 1244 with an ANPL structure as show in FIG. 10 is generated, wherein the active layer 1244 contains a host layer 12441 with inclusions of the first nano-particles 12442, i.e. the light emitting nano-particles, and inclusions of the second nano-particles 12443, i.e. the current blocking nano-particles. For example, the host layer 12441 is an undoped GaN layer with a thickness of 10~100 nm. In this preferred embodiment, the first nano-particles 12442 for light emitting are made of indium-gallium nitride whose particle diameter is ranged from 10 to 100 nm, and the second nano-particles 12443 for current blocking are made of gallium-aluminum nitride or boron-aluminum gallium nitride, whose particle diameter is ranged from 5 to 50 nm, preferably.

The second contact layer 1245 on the active layer 1244 is a p-type contact layer with a thickness of 0.5 μm which is made of a p-type GaN layer doped by magnesium (Mg) with a doping level of about $10^{18} \sim 10^{21}$ atoms/cm$^3$. The second electrode 1246 on the second contact layer 1245 is typically a transparent metallic alloy contact.

Figure 13:
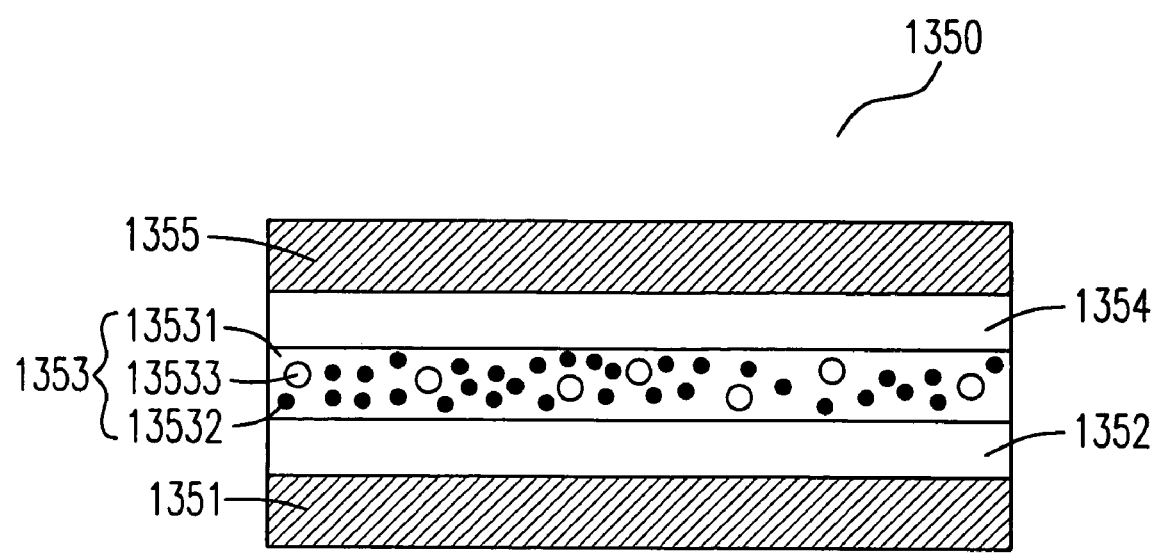
FIG. 13 is a diagram illustrating an ANPL light emitting diode (LED) for generating a white light according to a seventh preferred embodiment of the present invention.

Please refer to FIG. 13, which schematically shows another white ANPL light emitting diode (LED) for generating a white light according to a seventh preferred embodiment of the present invention. The white ANPL LED 1350 includes a layer sequence of a first electrode 1351, a first contact 1352, an active layer 1353 and a second contact layer 1354 as well as a second electrode 1355 thereon.

In this embodiment, the first electrode 1351 is typically made of a metallic alloy, on which the first electrode 1352, which is an n-type contact made of n-type doped GaN, is applied. On this layer the active layer 1353 with an ANPL structure as show in FIG. 10 is generated, wherein the active layer 1353 contains a host layer 13531 with inclusions of the first nano-particles 13532, i.e. the light emitting nano-particles, and inclusions of the second nano-particles 13533, i.e. the current blocking nano-particles. For example, the host layer 13531 is an undoped GaN layer with a thickness of 10~100 nm. In this preferred embodiment, the first nano-particles 13532 for light emitting are made of indium-gallium nitride whose particle diameter is ranged from 10 to 100 nm, and the second nano-particles 13533 for current blocking are made of gallium-aluminum nitride or boron-aluminum gallium nitride, whose particle diameter is ranged from 5 to 50 nm, preferably.

Moreover, the second contact layer 1354 on the active layer 1353 is a p-type contact layer made of a p-type GaN layer doped by magnesium (Mg). The second electrode 1355 on the second contact layer 1354 is typically a transparent metallic alloy contact.

Figure 14:
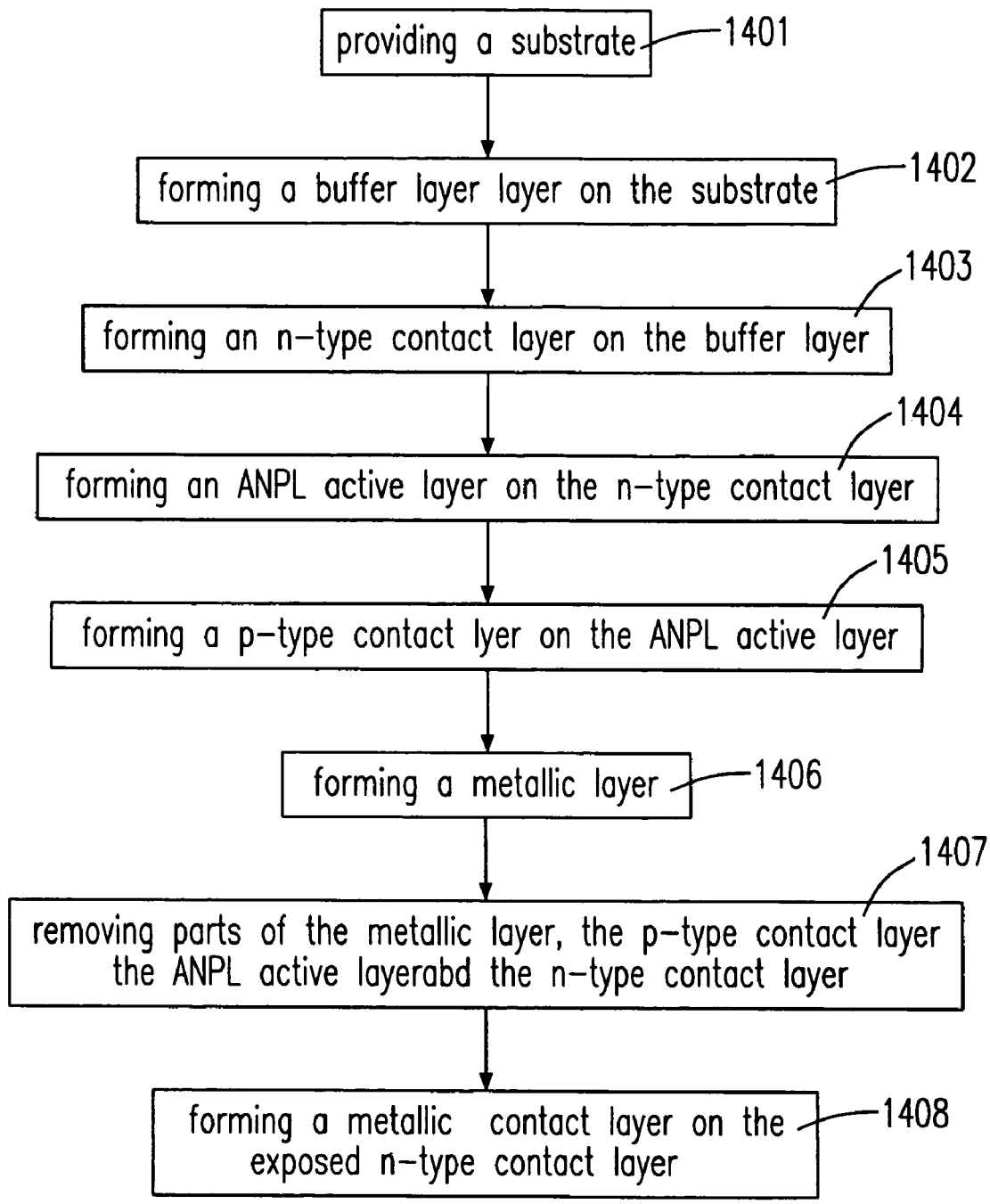
FIG. 14 is a flow chart illustrating a method for fabricating an ANPL LED according to the preferred embodiment of the present invention.

In addition, a method for fabricating the light emitting semiconductor device with the ANPL structure according the mentioned embodiments is also provided in the present invention. Please refer to FIG. 14, which is a flow chart illustrating the provided method. First, a substrate is provided and thereon a buffer layer is deposited as shown in the steps 1401 and 1402, respectively. On the buffer layer an n-type contact layer and an active layer with plural nano-particles are deposited in order as shown in the steps 1403 and 1404, respectively. Afterward, a p-type contact layer is deposited on the active layer as shown in the step 1405, and a metallic layer is formed on the p-type contact layer as a p-electrode as shown in the step 1406. After removing parts of the metallic layer, the p-type contact layer, the active layer and the n-type contact layer via etching, the n-type contact layer is exposed and thereon a further contact layer is deposited as an n-electrode, as shown in the steps 1407 and 1408, respectively.

Furthermore, it is worthy to be mentioned that various light emitting semiconductors including the blue ANPL LED, the white ANPL LED and the laser diode are able to be simply fabricated via selecting the materials for the layers and the nano-particles appropriately in the mentioned steps.

Based on the above, the present invention provides a novel light emitting semiconductor device with an ANPL structure, i.e. the ANPL LED, whose light extraction efficiency is significantly enhanced. In the present invention, the ANPL structure contains two different kinds of nano-particles for light emitting, e.g. the InGaN particles, and for current blocking, i.e. the AlGaN or the BGaAlN particles, respectively. The provided ANPL LED is advantageous for having those nano-particles that replace the quantum well in a conventional active layer of the LED.

The provided ANPL LED exhibits a higher efficiency of light generation since the structural property of those nano-particles is better than the conventional active quantum well. Besides, the radiative efficiency of ANPL structure only slightly senses to the threading dislocation causing non-radiative recombination since the lateral motion of electrons and holes in the ANPL structure is also suppressed by those nano-particles. Moreover, the laterally propagating lights captured in the ANPL LED are scattered by those nano-particles and further converted into vertical lights which can escape the ANPL LED through the front surface thereof, and the leakage currents are eliminated by the current blocking nano-particles, so that the light efficiency of light extraction is significantly improved.

Furthermore, the present invention allows it to produce effective white LED with direct generation of white light in the active layer with an ANPL structure and without using a phosphorous.

Hence, the present invention not only has a novelty and a progressive nature, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A light emitting semiconductor device comprising:
a substrate;
a buffer layer on said substrate;
a first contact layer having a first type of a dopant on said buffer layer;
an active layer having a plurality of first nano-particles on said first contact layer; and
a second contact layer having a second type of a dopant on said active layer.

2. The light emitting semiconductor device according to claim 1, wherein said substrate is made of an aluminum oxide.

3. The light emitting semiconductor device according to claim 1, wherein said buffer layer is made of a gallium nitride.

4. The light emitting semiconductor device according to claim 1, wherein said first contact layer comprises a layer of a silicon-doped gallium nitride.

5. The light emitting semiconductor device according to claim 1, wherein said first contact layer is an n-type contact layer.

6. The light emitting semiconductor device according to claim 5, wherein said second contact layer is a p-type contact layer.

7. The light emitting semiconductor device according to claim 1, wherein said active layer is made of a semiconducting material.

8. The light emitting semiconductor device according to claim 7, wherein said semiconducting material is one of a gallium nitride and a boron-aluminum-gallium nitride.

9. The light emitting semiconductor device according to claim 1, wherein said plurality of first nano-particles are made of an indium-gallium nitride.

10. The light emitting semiconductor device according to claim 1, wherein said plurality of first nano-particles are covered by a first shell.

11. The light emitting semiconductor device according to claim 1, wherein said first shell is made of one selected from a group consisting of a boron-aluminum-gallium nitride, a silicon oxide and a silicon nitride.

12. The light emitting semiconductor device according to claim 1, wherein said active layer further comprises a plurality of second nano-particles.

13. The light emitting semiconductor device according to claim 12, wherein said plurality of second nano-particles are made of a boron-aluminum-gallium nitride.

14. The light emitting semiconductor device according to claim 12, wherein said plurality of second nano-particles are covered by a second shell.

15. The light emitting semiconductor device according to claim 14, wherein said second shell is made of one selected from a group consisting of a boron-aluminum-gallium nitride, a silicon oxide and a silicon nitride.

16. The light emitting semiconductor device according to claim 1, wherein said nano-particles have a particle size ranged from 10 nanometers to 1000 nanometers.

17. The light emitting semiconductor device according to claim 1, wherein said second contact layer comprises a layer of a magnesium-doped gallium nitride.

18. The light emitting semiconductor device according to claim 1, further comprising a first cladding layer having said first type of said dopant and sandwiched between said first contact layer and said active layer.

19. The light emitting semiconductor device according to claim 18, further comprising a second cladding layer having said first type of said dopant and sandwiched between said active layer and said second contact layer.

20. A method for fabricating a light emitting semiconductor device, comprising steps of:
(a) providing a substrate;
(b) forming a buffer layer on said substrate;
(c) forming a first contact layer having a first type of a dopant on said buffer layer, wherein said first contact layer has a dopant of a first type;
(d) forming an active layer having a plurality of nano-particles on said first contact layer;
(e) forming a second contact layer having a second type of a dopant on said active layer;
(f) forming a metallization layer on said second contact layer;
(g) removing a part of said metallization layer, said second contact layer, said active layer and said first contact layer so as to expose at least a part of said first contact layer; and
(h) forming a third contact layer on said exposed first contact layer.

21. A method for fabricating a light emitting semiconductor device, comprising steps of:
(a) providing a substrate;
(b) forming a buffer layer having a plurality of nano-particles on said substrate;
(c) forming a first contact layer having a first type of a dopant on said buffer layer;
(d) forming an active layer with quantum wells on said first contact layer; and
(e) forming a second contact layer having a second type of a dopant on said active layer.

* * * * *